(12) United States Patent
Benedict et al.

(10) Patent No.: US 11,468,942 B2
(45) Date of Patent: Oct. 11, 2022

(54) SYSTEM AND METHOD FOR DETECTING MEMORY CELL DISTURBANCE BY MONITORING CANARY CELLS

(71) Applicant: Hewlett Packard Enterprise Development LP, Houston, TX (US)

(72) Inventors: Melvin K. Benedict, Magnolia, TX (US); Eric L. Pope, Tomball, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 17/189,897

(22) Filed: Mar. 2, 2021

(65) Prior Publication Data

US 2022/0284944 A1 Sep. 8, 2022

(51) Int. Cl.
*G11C 16/04* (2006.01)
*G11C 11/4078* (2006.01)
*G11C 11/403* (2006.01)

(52) U.S. Cl.
CPC ........ *G11C 11/4078* (2013.01); *G11C 11/403* (2013.01)

(58) Field of Classification Search
CPC .......................... G11C 11/4078; G11C 11/403

USPC ....................................................... 365/185.02
See application file for complete search history.

(56) References Cited

U.S. PATENT DOCUMENTS

| | | | |
|---|---|---|---|
| 7,057,939 B2 | 6/2006 | Li et al. | |
| 10,885,976 B2 | 1/2021 | Ha | |
| 2005/0237814 A1 | 10/2005 | Li et al. | |
| 2008/0106935 A1* | 5/2008 | Kim | ...................... H01L 27/115 257/E21.691 |
| 2019/0096472 A1 | 3/2019 | Kang et al. | |
| 2019/0287632 A1* | 9/2019 | Asano | ...................... G11C 8/12 |
| 2020/0066342 A1 | 2/2020 | Ha | |
| 2022/0115057 A1 | 4/2022 | Pope et al. | |

* cited by examiner

*Primary Examiner* — Huan Hoang
(74) *Attorney, Agent, or Firm* — Park, Vaughan, Fleming & Dowler LLP

(57) ABSTRACT

One embodiment provides a memory module. The memory module includes a plurality of rows of memory cells, with a respective row comprising one or more canary memory cells that are more susceptible to disturbance than non-canary memory cells, and a disturbance-detection circuit coupled to at least one canary memory cell of a corresponding row and configured to output a control signal in response to the disturbance to the canary memory cell exceeding a predetermined threshold.

18 Claims, 6 Drawing Sheets

SYSTEM AND METHOD FOR DETECTING MEMORY CELL DISTURBANCE BY MONITORING CANARY CELLS

BACKGROUND

Field

This disclosure is generally related to detection of degradation of memory cells. More particularly, this disclosure is related to memory cell disturbance detection based on canary cells (i.e., cells that are significantly more sensitive to disturbance) in the memory.

Related Art

The continued advance in memory (e.g., dynamic random-access memory (DRAM)) technologies results in increased cell densities, meaning that memory cells are placed increasingly close to each other. Although the high cell density provides the advantage of lowering the cost per bit of memory, it also has a negative impact on memory reliability. More particularly, high-density DRAM is more likely to suffer from disturbance, which refers to the phenomenon of different memory cells interfering (e.g., typically through parasitic structures) with each other's operation.

Row hammer (RH) is type of disturbance that occurs when a specific row of a DRAM is activated repeatedly within a refresh interval, causing neighboring cells to leak charge at a faster rate than expected. If the retention time of the leaking cells becomes less than the refresh cycle, these cells may lose their data before the refresh happens. Therefore, during the refreshing process the corrupted data will be read and written back again to the DRAM, causing errors in the memory. It has been shown that the row hammer effect can be exploited by malicious users to gain access to or control of the memory. Therefore, mitigating the effect of row hammer is important to ensure the reliability of the memory.

BRIEF DESCRIPTION OF THE FIGURES

In the figures, like reference numerals refer to the same figure elements.

DETAILED DESCRIPTION

The following description is presented to enable any person skilled in the art to make and use the embodiments and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the scope of the present disclosure is not limited to the embodiments shown but is to be accorded the widest scope consistent with the principles and features disclosed herein.

The disclosed embodiments provide solutions to the technical problem of mitigating the "row hammer" effect in a memory. More specifically, the memory can implement canary cells (i.e., memory cells that are weaker and more prone to leaking charge when disturbed). By monitoring the status of the canary cells, disturbance to the memory cells (e.g., possible row hammer events) can be detected and remedial measures (e.g., executing additional refresh cycles) can be deployed in a timely fashion before real damage is done to the memory contents. In one embodiment, the status of a canary cell is monitored using an RH detection circuitry coupled to the canary cell. The RH detection circuitry can include one or more transistors. The leakage of charge to and from the canary cell can turn on or off the transistor(s), thus generating an RH-detection output. The RH-detection output can in turn trigger the execution of remedial memory operations (e.g., on-demand refresh operations) according to a predetermined policy. In addition to detecting disturbance to memory cells, a similar detection circuitry can also be used to detect other types of memory issues. For example, the detection circuitry can be used to detect variable retention rate (VRT) defects, which are caused by increased aging rates of certain memory cells as the aging process increases the charge leakage.

Figure 1:
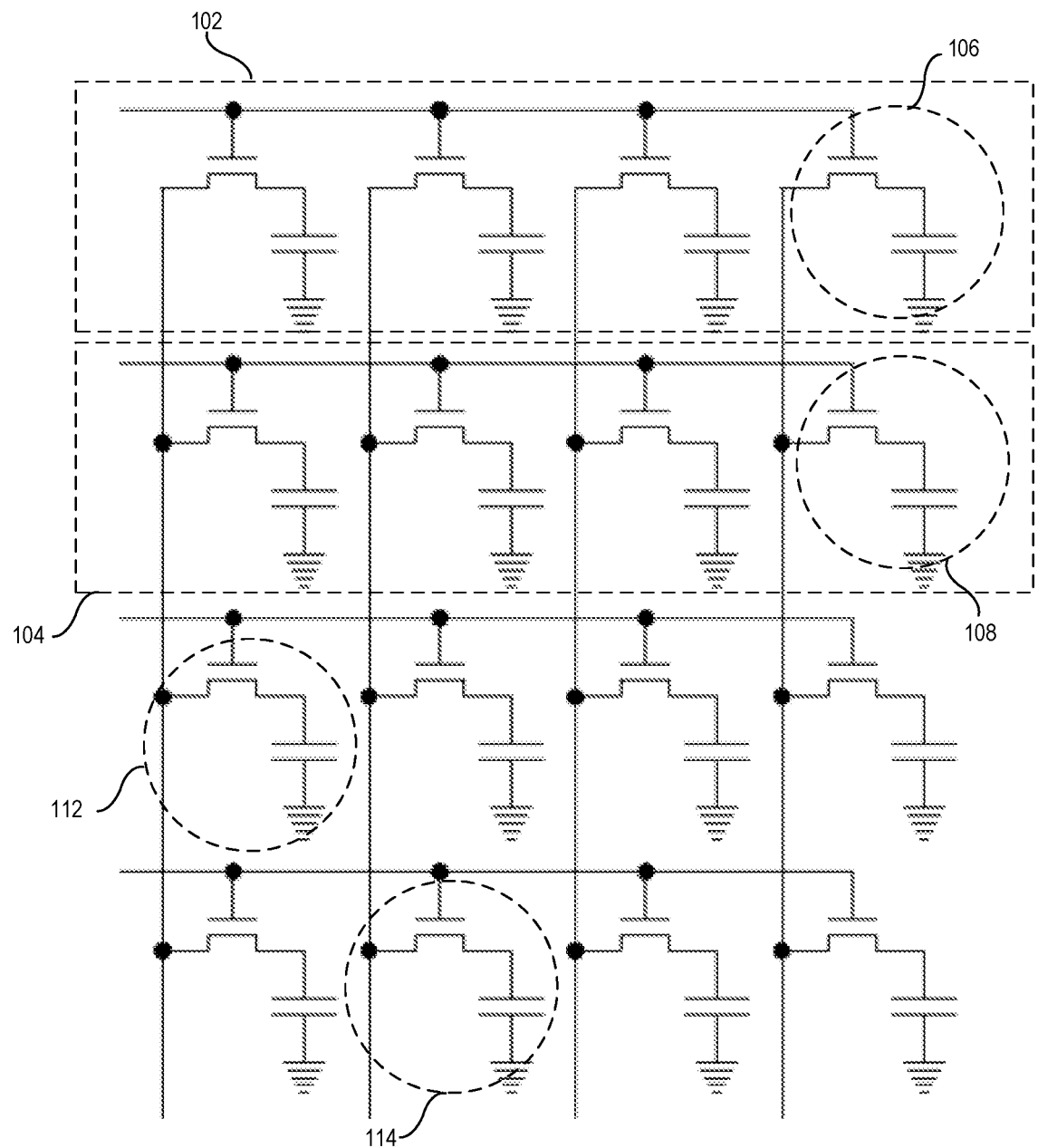
FIG. 1 illustrates a schematic of an exemplary memory cell array implementing canary cells for row hammer (RH) detection, according to one embodiment.

FIG. 1 illustrates a schematic of an exemplary memory cell array implementing canary cells for RH detection, according to one embodiment. In FIG. 1, memory cell array 100 can include a plurality of memory cells arranged into an array with rows and columns. Each memory cell can include a capacitor that hold charge and a transistor that can be turned on or off to charge (e.g., write) or discharge (e.g., read) the capacitor.

Memory cells in a row (e.g., row 102 or row 104) can be activated at the same time and can also be subjected to RH from an adjacent row. For example, repeated activation of row 102 can cause memory cells in row 104 to leak charge. Similarly, repeated activation of row 104 can cause memory cells in row 102 to leak charge. As discussed before, the loss of charge from memory cells can result in the memory cells losing their data before the next memory refresh operation or read/write operation. If double hammer or, by extension, N-way hammer, where a victim row is attacked from more than one side, occurs, the victim row may lose data at a faster rate, resulting in more severe RH effects. As discussed before, the RH effects can also be exploited by hackers to gain access to or control of the memory. To mitigate the negative impact of RH effects, it is important to detect RH before the cell charge is depleted. In some embodiments, canary cells can be implemented in a memory array to detect RH before normal memory cells suffering RH lose their charge.

In some embodiments, each row of memory cells can include one or more canary cells, which are weaker memory cells and are more susceptible to RH than regular cells. In other words, a canary cell will lose its charge at a faster rate than a normal memory cell. Hence, by monitoring the status of the canary cell, one can quickly detect RH before those cells on the same row of the canary cell lose all their charge. In the example shown in FIG. 1, rows 102 and 104 include canary cells 106 and 108, respectively, and canary cells 112 and 114 are each located on a different row. Note that it is not necessary to place the canary cells in the same column.

In fact, the canary cells can be placed randomly in the memory. In the example shown in FIG. 1, each row includes a single canary cell. In practice, the number of canary cells in each row can be one or more than one. All canary cells can be preconfigured to hold charge (e.g., representing logic "1"). When RH occurs, a canary cell (e.g., cell 106) loses its charge and flips from a logic "1" to a logic "0."

Hence, RH detection can be achieved by reading the bit value of the canary cell. If the value stored in a canary cell is changed from "1" to "0," it indicates that the entire row has experienced RH. Because the canary cell loses its charge faster than regular cells, when the bit value stored in the canary cell is flipped (e.g., from "1" to "0"), regular memory cells may still retain a portion of their charge and hold the correct data. Consequently, if RH on a particular row is detected by the canary cell in that row and remedial measures are timely applied, the effect of RH on that row can be reduced or even eliminated.

However, detecting RH by reading the canary cells requires additional memory-read operations, which can require additional control logic. Moreover, the additional read operations can also incur energy and performance overhead of the memory. To reduce energy consumption and simplify the RH-detection operation, in some embodiments, instead of reading the canary cells, the status of the canary cells can be monitored by an RH-detection circuitry, which generates an RH-detection output to indicate that RH on a particular row has been detected.

Figure 2:
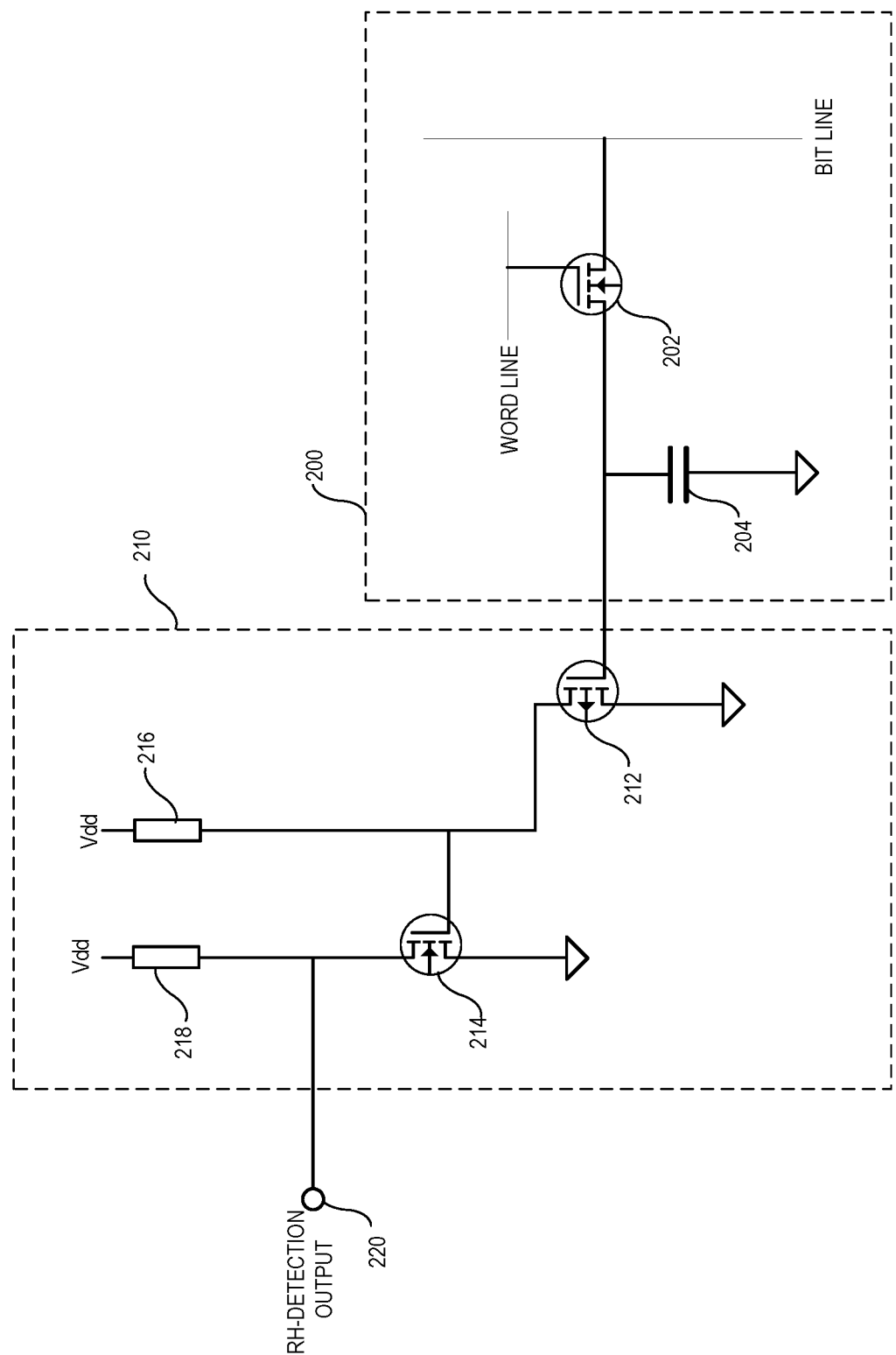
FIG. 2 illustrates an exemplary row-hammer-detection circuitry, according to one embodiment.

FIG. 2 illustrates an exemplary row-hammer-detection circuitry, according to one embodiment. In FIG. 2, a canary cell 200 can include a transistor 202 and a capacitor 204. In the example shown in FIG. 2, transistor 202 is an n-channel metal oxide semiconductor field-effect transistor (MOS-FET), which is a commonly used building block for semiconductor memories, although it is also possible construct memory cells using other types of transistors. Note that canary cell 200 can have the same structure as regular memory cells. However, canary cell 200 can be specially designed to be weaker than a regular memory cell, meaning that, when disturbed (e.g., due to RH), canary cell 200 leaks charge at a higher rate. This can be done by slightly varying the design (e.g., dimensions) of transistor 202 and capacitor 204 compared to the transistors and capacitors in regular or normal memory cells. In some embodiments, canary cell 200 can be designed to leak charge at a rate that is 10%-30% higher than that of average memory cells. There is a tradeoff between the sensitivity of the canary cell and energy efficiency.

FIG. 2 also shows that canary cell 200 is coupled to an RH-detection circuitry 210. RH-detection circuitry 210 includes a p-channel transistor 212 directly coupled to canary cell 200 and an n-channel transistor 214 coupled to transistor 212. RH-detection circuitry 210 can further include resistors 216 and 218 that are coupled to p-channel transistor 212 and n-channel transistor 214, respectively. P-channel transistor 212 is coupled to canary cell 200 in such a way that the gate of p-channel transistor 212 is coupled to capacitor 204 and n-channel transistor 202. The gate of n-channel transistor 214 is coupled to the source of p-channel transistor 212. The output of RH-detection circuitry (i.e., output 220) is coupled to the drain of n-channel transistor 214.

Canary cell 200 can operate like a regular memory cell. In the example shown in FIG. 2, the combination of canary cell 200 and RH-detection circuitry 210 is designed to detect an unwanted change (e.g., resulting from RH) of its state from a logic "1" to a logic "0." Hence, canary cell 200 is always configured to store logic "1" initially. Accordingly, normal memory write or memory refresh operations performed on canary cell 200 would charge capacitor 204 to an appropriate level.

When neighboring rows of memory cells (not shown in FIG. 2) are activated (e.g., during a memory read operation), capacitor 204 is discharged due to electrical coupling. Repeated activations of the neighboring rows can continue to discharge capacitor 204. If the capacitor 204 is discharged sufficiently within a memory refresh cycle (e.g., 64 ms), p-channel transistor 212 is turned on, which in turn turns off n-channel transistor 214. When n-channel transistor 214 is turned off, the voltage level of RH-detection output 220 goes from low to high. Note that, although it is possible to generate an RH output by sampling the voltage of the source node of p-channel transistor 212, including the additional transistor (i.e., n-channel transistor 214) can provide isolation between the control circuitry that operates based on RH-detection output 220 and canary cell 200.

Once the voltage level of RH-detection output 220 goes from low to high, it indicates that a possible RH event on this particular row is detected. In some embodiments, RH-detection output 220 can be coupled to a register. The output of the register can trigger the control logic of the memory to take remedial measures according to a predetermined remedial policy. In one embodiment, the control logic may include a self-refresh logic that executes an out-of-sequence refresh cycle (i.e., the refresh cycle is not part of the periodic refresh cycle routinely performed on the memory) when the RH event is detected. The refresh cycle may be applied to the particular row where the canary cell detecting the RH event is located, or it may be applied to a number of rows that include the particular row and its neighboring rows within a predetermined range (e.g., up to eight rows).

In an alternative embodiment, instead of executing the out-of-sequence refresh cycle, the control logic can use the existing refresh management (RFM) structure by adding the particular row (or the particular row and its neighboring rows) to the group of rows to be refreshed in the next RFM command.

Therefore, when the next RFM command is executed, the affected rows will be refreshed. The timely refresh of the rows affected by RH can significantly reduce the security risk posed by RH.

The leakage rate of the charge is affected not only by the cell structure but also by the stored data. In other words, the RH effect on memory cells storing logic "1" and memory cells storing logic "0" is different. In the example shown in FIG. 2, the canary cell and the RH-detection circuitry are configured to detect RH events occurring on memory cells originally storing a logic "1" or to detect the unwanted transition from the "1" state to the "0" state. It is also desirable to have a mechanism that can accurately or timely detect RH events that occur on memory cells originally storing a logic "0" or to detect the unwanted transition from the "0" state to the "1" state. To do so, the canary cells need to be configured to store "0s" and a slight modification to the RH-detection circuitry is needed.

Figure 3:
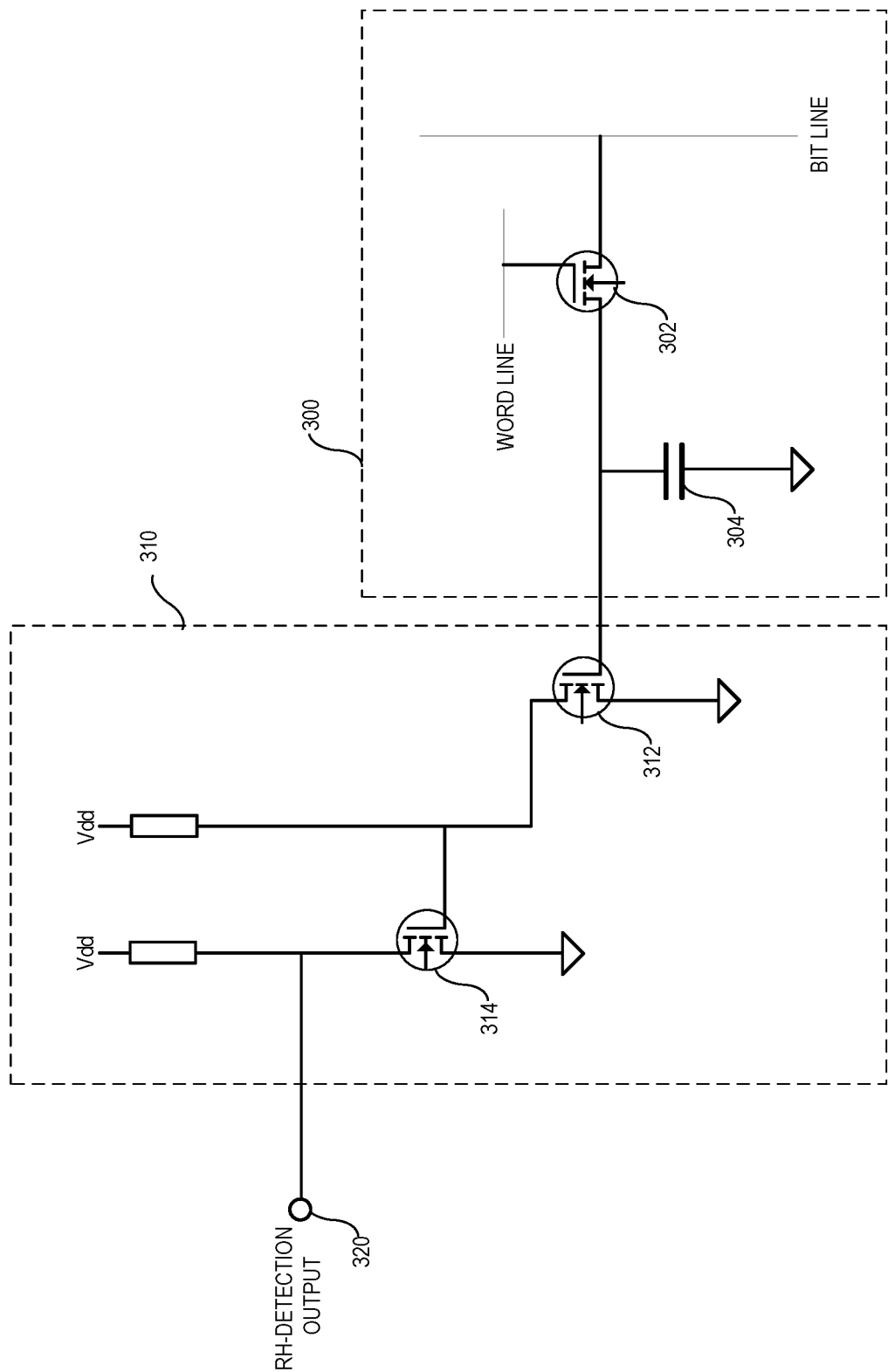
FIG. 3 illustrates an exemplary row-hammer-detection circuitry, according to one embodiment.

FIG. 3 illustrates an exemplary row-hammer-detection circuitry, according to one embodiment. Similar to what is shown in FIG. 2, FIG. 3 illustrates a canary cell 300 and an RH-detection circuitry 310. Like canary cell 200, canary cell 300 includes an n-channel transistor 302 and a capacitor 304. Note that, unlike canary cell 200, canary cell 300 is configured to store logic "0," meaning that capacitor 304 is not charged after each refresh cycle.

RH-detection circuitry 310 includes two n-channel transistors, transistor 312 and transistor 314. The gate of n-channel transistor 312 is coupled to capacitor 304, and the gate of n-channel transistor 314 is coupled to drain of transistor 312. In other words, the on and off of transistor 312 is controlled by the voltage across capacitor 304, and the on and off of transistor 314 is controlled by the transistor 312.

Under normal circumstances (i.e., no RH is occurring), capacitor 304 is not charged, meaning that n-channel transistor 312 is turned off. However, during electrical coupling, repeated activations of neighboring rows of memory cells can cause capacitor 304 to be charged. When there is sufficient charge on capacitor 304, n-channel transistor 312 is turned on, which in turn causes n-channel transistor 314 to be also turned off. Like the previously discussed scenario shown in FIG. 2, when n-channel transistor 314 is turned off, the voltage level of RH-detection output 320 goes from low to high, indicating that a possible RH event is detected. The output signal generated by RH-detection circuitry 310 can trigger additional control logic to take aforementioned remedial measures (e.g., executing an additional refresh operation or adding affected rows to an existing to-be-executed refresh operation). Regardless of whether the RH event is detected due to a state change from "1" to "0" or a state change from "0" to "1," the remedial policy can be similar.

In the example shown in FIGS. 2 and 3, the RH-detection is done via a single canary cell. In practice, each row of memory cells may include multiple canary cells scattered around (e.g., in a random fashion). Due to variations in the fabrication process, the memory cells may have different properties and experience RH differently. Including multiple canary cells in each row at different locations can ensure that all RH events can be detected in a timely fashion. When there are multiple canary cells in a row, the RH-detection circuitry can simultaneously couple, in parallel, the multiple canary cells. This way, whenever a canary cell detects an RH event, the RH-detection circuitry can output an RH-detection signal.

Figure 4:
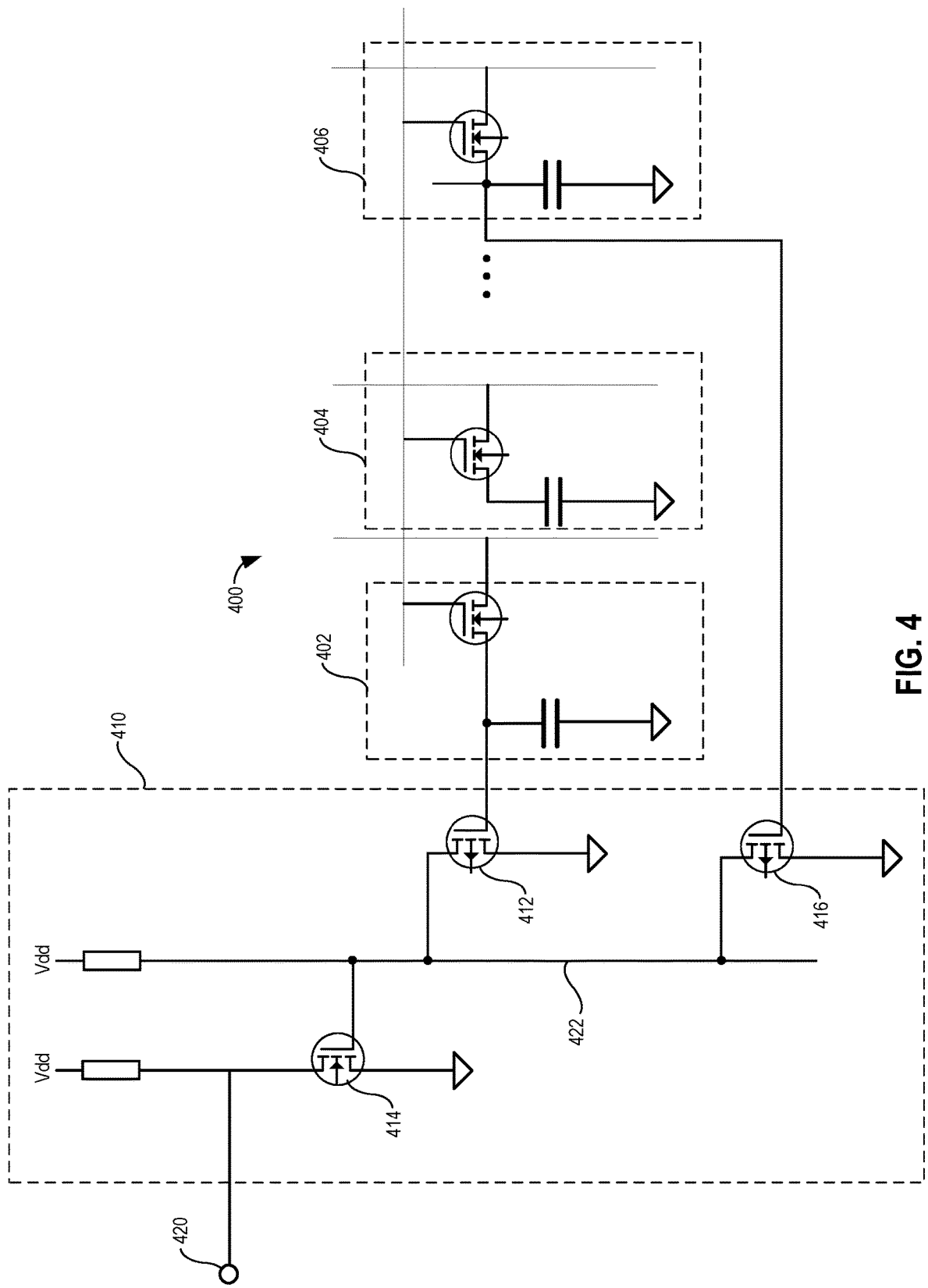
FIG. 4 illustrates an exemplary a row-hammer-detection circuitry, according to one embodiment.

FIG. 4 illustrates an exemplary row-hammer-detection circuitry, according to one embodiment. In FIG. 4, a memory-cell row 400 includes memory cells 402, 404, and 406. More specifically, memory cells 402 and 406 are canary cells, whereas memory cell 404 is a normal, non-canary memory cell. FIG. 4 also shows an RH-detection circuitry 410, which can include an n-channel transistor 414 and multiple p-channel transistors (e.g., transistors 412 and 416).

The multiple canary cells (e.g., cells 402 and 406) in row 400 can be coupled to RH-detection circuitry 410. More specifically, the capacitor within each canary cell can be coupled to an individual p-channel transistor (which can also be referred to as the RH-detection transistor). On the other hand, the capacitor of a regular memory cell is not coupled to an RH detection transistor. For example, the capacitor of canary cell 402 is coupled to the gate of transistor 412, and the capacitor of canary cell 406 is coupled to the gate of transistor 416. All RH-detection transistors (e.g., transistors 412 and 416) are coupled to each other in parallel with their source coupled to an RH-detection line 422, which is in turn coupled to the gate of n-channel transistor 414.

Under normal (i.e., no RH) circumstances, all canary cells in row 400 store a bit value of "1," meaning that their capacitors have been charged to a predetermined level. Due to variations in the fabrication process, the charge level may vary slightly among the different capacitors. When one or more rows neighboring row 400 are activated, the capacitors of the canary cells start to leak charge. The variation in the cell-fabrication process can also lead to the different discharge rates. If any one of the capacitors has leaked enough charge to cause the voltage level on the gate of the corresponding RH-detection path transistor to be sufficiently low, the corresponding RH-detection transistor will be turned on. Because all RH-detection transistors are connected in parallel, even if only one RH-detection transistor is on, the voltage level on RH-detection line 422 will go from high to low, leading to an RH-detection signal being generated at RH-detection output 420 to indicate the detection of a possible RH event on this particular row. The RH-detection signal can then be used to trigger subsequent remedial measures to prevent normal memory cells (e.g., cell 404) from losing their stored data. In one embodiment, the remedial measure can be the execution of an additional refresh cycle to refresh data stored in row 400. In an alternative embodiment where RFM is implemented, the remedial measure can be adding row 400 and possibly a few of its neighboring rows to the next RFM command to be executed, such that when the next RFM command is executed, row 400 and possibly a few of its neighboring rows can be refreshed, before the normal cells (e.g., cell 404) in row 400 lose their data.

It is possible that a row in the memory is equipped with both types of canary cells (i.e., the canary cells used for detecting the unwanted "1" to "0" transitions and the canary cells used for detecting the unwanted "0" to "1" transitions). This means that some canary cells will be configured to store a bit value of "1," and some canary cells will be configured to store a bit value of "0." The RH-detection circuitry also needs to be modified to be able to detect both types of transition.

Figure 5:
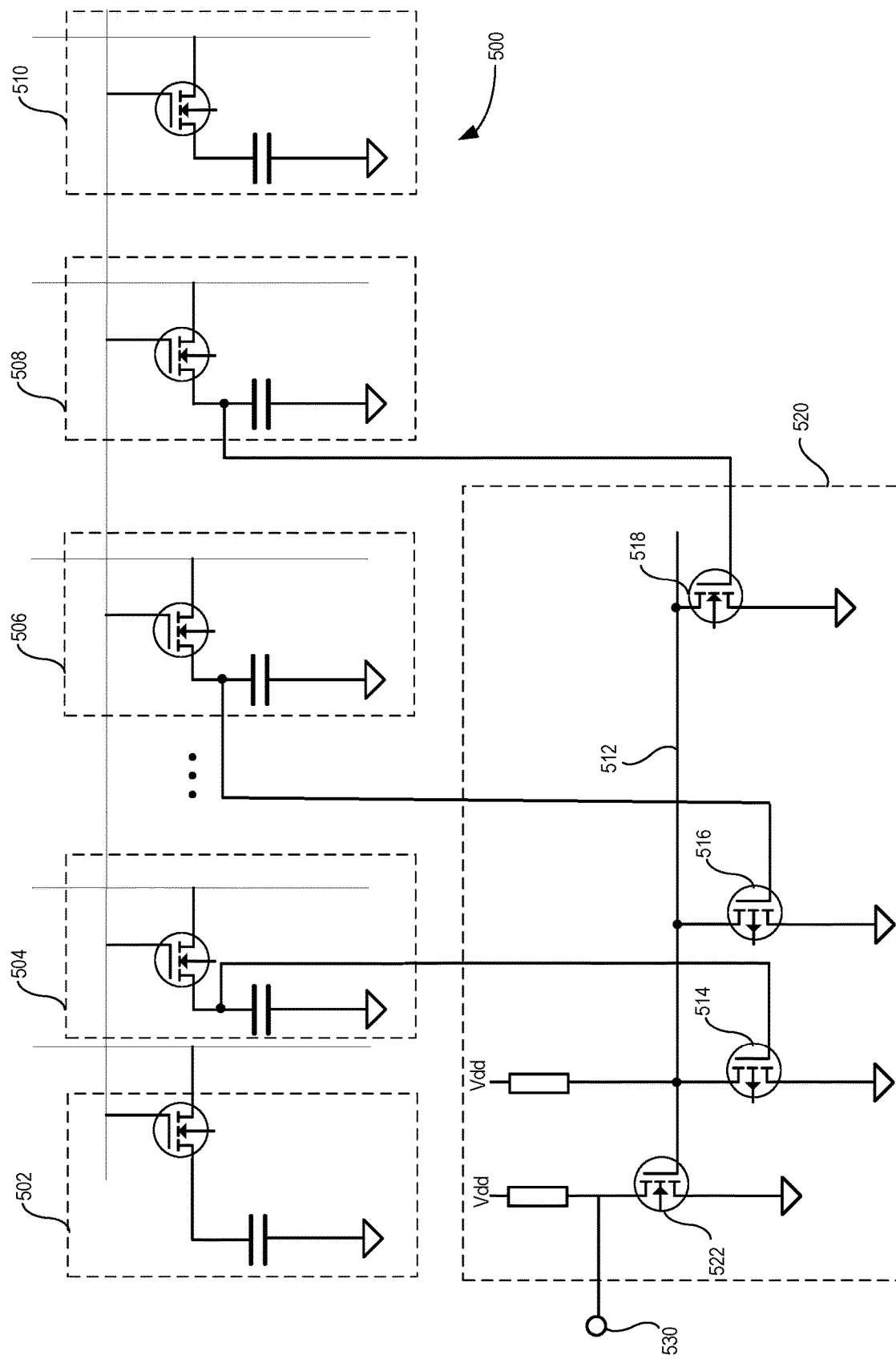
FIG. 5 illustrates an exemplary a row-hammer-detection circuitry, according to one embodiment.

FIG. 5 illustrates an exemplary row-hammer-detection circuitry, according to one embodiment. In FIG. 5, a memory-cell row 500 includes a number of memory cells, e.g., cells 502-510, with each memory cell including a transistor and a capacitor. In this example, memory cells 502 and 510 are normal memory cells that store data. Memory cells 504 and 506 are canary cells for detecting the "1" to "0" transitions and are configured to always store the logic state of "1." Canary cells 504 and 506 are similar to canary cell 200 shown in FIG. 2. On the other hand, memory cell 508 is a canary cell for detecting the "0" to "1" transitions and is configured to always store the logic state of "0." Canary cell 508 is similar to canary cell 300 shown in FIG. 3.

Like the RH-detection circuitry shown in FIG. 4, RH-detection circuitry 520 includes a bank of RH-detection transistors, each coupled to a canary cell, and an n-channel transistor 522. The RH-detection transistor bank includes a number of p-channel transistors (e.g., transistors 514 and 516) that are respectively coupled to the canary cells for detecting the "1" to "0" transitions (e.g., cells 504 and 506), and a number of n-channel transistors (e.g., transistor 518) that are respectively coupled to the canary cells for detecting the "0" to "1" transitions (e.g., cell 508).

More specifically, similar to what is shown in FIG. 4, the RH-detection transistors are connected to each other in parallel, with their source or drain nodes coupled to RH-detection line 512. For example, transistors 514, 516, and 518 are coupled to each other in parallel. The source nodes of p-channel transistors 514 and 516 are coupled to RH-detection line 512, and the drain node of n-channel transistor 518 is coupled to RH-detection line 512.

When row 500 is just refreshed, the canary cells for detecting the "1" to "0" transitions (e.g., cells 504 and 506) all store the bit value "1," meaning that their capacitors are charged to a predetermined level. Consequently, p-channel transistor 514 and 516 are turned off. When the neighboring row or rows of memory are activated (e.g., being read), due to the electrical coupling between adjacent rows, the capacitors of these canary cells start to leak charge. Note that, in addition to being affected by RH, the capacitors may leak charge due to other reasons. Because canary cells are weaker than normal memory cells, they leak charge at a faster rate than the normal memory cells. At some point, the weakest canary cell leaks enough charge such that the corresponding p-channel transistor is turned on, causing the voltage level on RH-detection line 512 to transition from high to low.

Similarly, when row 500 is just refreshed, the canary cells for detecting the "0" to "1" transitions (e.g., cell 508) all store the bit value "0," meaning that their capacitors are discharged and the corresponding n-channel transistors (e.g., transistor 518) are turned off. RH can cause the capacitors of these canary cells to accumulate charge. Because canary cells are weaker than normal memory cells, they accumulate charge at a faster rate than the normal memory cells. At some point, the weakest canary cell accumulates enough charge such that the corresponding p-channel transistor is turned on, causing the voltage level on RH-detection line 512 to transition from high to low.

In other words, the voltage level on RH-detection line 512 is determined by the on-off status of the RH-detection transistors, and the on-off status of each individual RH-detection transistor is determined by the level of charge on the capacitor coupled to the RH-detection transistor. In short, the voltage level on RH-detection line 512 reflects the level of charge on the capacitors of the memory cells in the particular row. Possible RH events can be detected by monitoring such a voltage level.

In the example shown in FIG. 5, the voltage level on RH-detection line 512 is monitored or sensed by an additional transistor (e.g., n-channel transistor 522), which can be turned on or off depending on its gate voltage (i.e., the voltage level of RH-detection line 512), thus generating an RH-detection signal at RH-detection output 530. The scope of this disclosure is not limited to the mechanism used for monitoring the voltage level on RH-detection line 512. A different type of transistor (e.g., a p-channel transistor) or a different type of circuit can be used to detect the voltage level on RH-detection line 512 to generate an RH-detection output.

By including both types of canary cells and their corresponding detection circuit in the RH-detection circuitry, the RH-detection circuitry is able to timely detect an RH event, regardless of whether it is an RH event causing canary cells to change their state from a bit "1" to a bit "0" or an RH event causing canary cells to change their state from a bit "0" to a bit "1."

In the examples shown in FIGS. 2-5, the transistors in the RH-detection circuitry are shown as MOSFETs. In practice, they are not limited to MOSFETs, and other transistor technologies can also be used to implement the transistors used in the RH-detection circuitry. Moreover, in addition to detecting RH, other effects that cause the memory cells to lose data due to capacitor leakage can also be detected using the circuitry or circuitries similar to the ones shown in FIGS. 2-5.

When an RH event on a particular row is detected (i.e., when an RH-detection output is generated), the control logic on the memory module will be triggered to apply remedial measures to mitigate the RH effect in a timely fashion. In one embodiment, a remedial measure can be automatically scheduling (in a timely fashion) an additional refresh cycle to restore data on the affected row or rows. Such automatic scheduling of memory refresh operation can be fast and efficient, because it bypasses the memory controller. However, bypassing the memory controller can lead to a possible collision between the out-of-sequence refresh operation and normal memory operations (e.g., read and write) issued by the memory controller, as the memory controller is not aware of the pending or ongoing refresh.

To mitigate this problem, in some embodiments, after detecting a potential RH event and after the control logic on the memory module (which is different from the external memory controller) schedules an out-of-sequence refresh operation on the affected row or rows, the control logic on the memory module can respond to the next read or write command issued by the memory controller with an error message (e.g., an error message indicating "command address parity error"), thus forcing the memory controller to resend the command after a predetermined interval. This can delay the execution of the read or write command, thus allowing the out-of-sequence refresh operation to be completed on the affected rows.

On the other hand, if a collision does occur, that is, if the read or write command issued by the memory controller arrives at the memory module when one or more rows included in the read or write command is being refreshed, the control logic on the memory can also handle the collision by responding to the read or write command with a similar error message (e.g., an error message indicating "command address parity error"). Similarly, such an error message can cause the reissuance of the read or write command after a predetermined time interval, thus allowing the ongoing out-of-sequence refresh operation on the affected row or rows to be completed before the actual execution of the read or write command. Note that, once the refresh operation is completed, the data on the affected row or rows are restored, thus significantly reducing the likelihood of errors in subsequent reading or writing of the row or rows.

Figure 6:
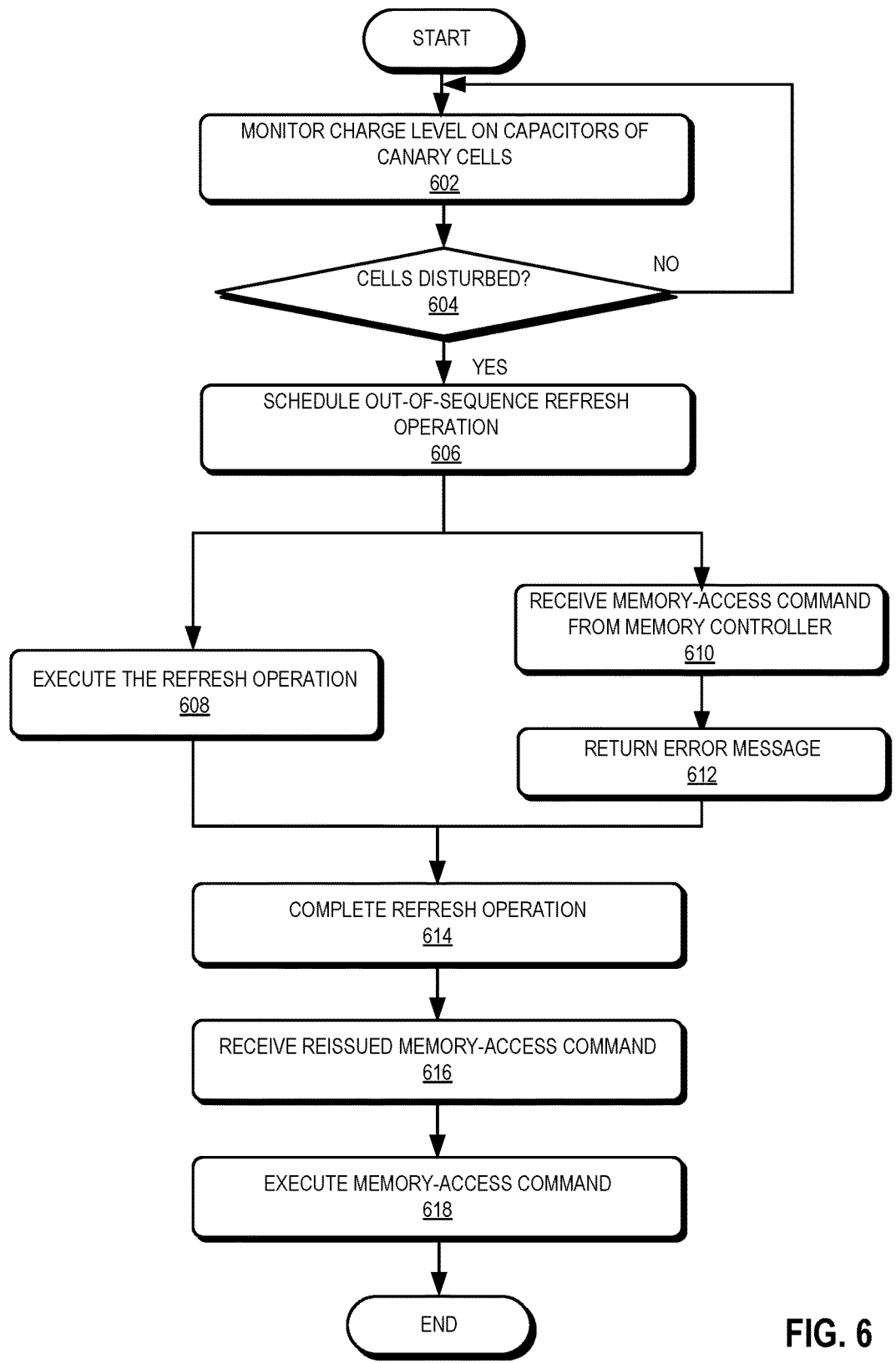
FIG. 6 illustrates a flowchart of an exemplary process for mitigating the RH effect, according to one embodiment.

FIG. 6 illustrates a flowchart of an exemplary process for mitigating RH effect, according to one embodiment. During operation, the control logic of a memory module monitors the level of charge on capacitors of one or more canary cells in a particular row of the memory (operation 602) and determines if memory cells in that row have been disturbed to a certain degree (operation 604). For example, when the disturbance reaches a predetermined threshold level, an RH event is detected. If no RH event is detected, the control logic continues to monitor the charge level of the capacitors (operation 602).

In one embodiment, the level of charge on each capacitor can be monitored by coupling the capacitor across the gate and drain/source a transistor. This way, the fluctuation of the charge level on the capacitor can turn on or off the transistor, depending on the initial level of charge and the type of transistor. For example, if the capacitor is initially charged to a predetermined level and is coupled between the gate node and the drain node of a p-type transistor, the discharging of the capacitor (e.g., to a predetermined level) will lead to the transistor being turned on. On the other hand, if the capacitor is initially discharged and is coupled between the gate node and the source node of a p-type transistor, the charging of the capacitor (e.g., to a predetermined level) will lead to the transistor being turned on. The on and off status of the transistor can be further monitored (e.g., via an additional transistor or transistors) to output an RH-detection signal to indicate that a potential RH event is detected. Note that the detected event is also referred to as a "potential" RH event, because when the RH effect causes the weaker canary cells to lose data, the normal, non-canary memory cells are still able to retain their data at the moment.

Without applying a remedial measure in time, the normal memory cells may also lose their data due to the RH effect. For simplicity, the possible or potential RH event can also be referred to as an RH event.

If an RF event is detected, the control logic of the memory module can schedule an out-of-sequence refresh operation on a memory region of a predetermined size that includes the particular row (operation 606). For example, the to-be-refreshed memory region can have eight rows. Note that this refresh is in addition to the routinely performed refresh cycles and the address of the to-be-refreshed memory region is determined based on the address of the row where the RH effect is detected. In some embodiments, this out-of-sequence refresh operation can be scheduled with minimum delay to ensure that the row experiencing RH can be timely refreshed.

The control logic of the memory module can subsequently execute the refresh operation (operation 608). In the meantime, the memory module may receive a memory-access command (e.g., read or write) for accessing the being-refreshed memory region (operation 610). Instead of executing the memory-access command, the control logic of the memory module returns an error message to the memory controller (operation 612). The error message can indicate a command address parity error, which triggers the memory controller to reissue the memory-access command, thus delaying the execution of the memory-access command.

Subsequent to the completion of the refresh operation (operation 614), the memory module receives the reissued memory-access command (operation 616) and executes the memory-access command (operation 618).

In some embodiments, when RFM is implemented, in response to detecting an RH event, the control logic of the memory module may simply add the rows experiencing RH to the list of to-be-refreshed memory regions in the next to-be-executed RFM command. This way, the rows experiencing RH can be refreshed when the RFM command is executed. Because the memory controller is aware of the RFM command, collision between this on-demand memory refresh operation and the normal memory activities (e.g., read or write) will not occur, as the memory controller will schedule the memory-access operations with the consideration of the execution of the RFM command.

In some embodiments, upon the detection of an RH event, instead of directly scheduling a refresh operation, the control logic on the memory module can send a signal (e.g., an RH-notification signal) to an external memory controller coupled to the memory module, notifying the memory controller that an RH event is detected. The control logic on the memory module can also store (e.g., in a register) the address of the row where RH is detected, and the RH-notification signal can include such an address. In response to receiving the RH-notification signal, the external memory controller can schedule an additional memory refresh command targeting the affected row and its surrounding region, according to a predetermined policy. The memory controller can further notify the upper level system of the detected RH event.

In addition to detecting disturbance to memory cells, the detection circuitries shown in FIGS. 2-5 can also be used to detect VRT defects. When in service, certain memory regions or cells may have an increased aging rate (e.g., due to heat), causing capacitors in these cells to leak charge faster. The embedded canary cells are similarly more sensitive to the aging effect and will cause a correspondingly coupled detection circuitry to generate an output in response to the amount of charge leak reaching a threshold.

One embodiment provides a memory module. The memory module includes a plurality of rows of memory cells, with a respective row comprising one or more canary memory cells that are more susceptible to disturbance than non-canary memory cells, and a disturbance-detection circuit coupled to at least one canary memory cell of a corresponding row and configured to output a control signal in response to the disturbance to the canary memory cell exceeding a predetermined threshold.

In a variation on this embodiment, the disturbance-detection circuit comprises at least a first transistor coupled to a capacitor within the canary memory cell, wherein the first transistor is configured to be turned on when the disturbance to the canary memory cell exceeds the predetermined threshold.

In a further variation, the capacitor is charged to a predetermined level without the disturbance, the disturbance causes the capacitor to discharge, and the first transistor is a p-type transistor such that the p-type transistor is turned on when the capacitor is discharged to a predetermined level.

In a further variation, a group of canary memory cells are respectively coupled to a group of p-type transistors, and the group of p-type transistors are coupled to each other in parallel.

In a further variation, the capacitor is discharged without the disturbance, the disturbance causes the capacitor to charge, and the first transistor is an n-type transistor such that the n-type transistor is turned on when the capacitor is charged to a predetermined level.

In a further variation, a group of canary memory cells are respectively coupled to a group of n-type transistors, and the group of n-type transistors are coupled to each other in parallel.

In a further variation, the disturbance-detection circuit comprises a second transistor coupled to the first transistor. An on-off status of the second transistor is determined by an on-off status of the first transistor, and the disturbance-detection circuit is configured to output the control signal in response to a change of the on-off status of the second transistor.

In a variation on this embodiment, the memory module further includes a control logic. The control logic is configured to schedule a refresh operation on the corresponding row or send a notification signal to an external memory controller coupled to the memory module to allow the external memory controller to schedule a refresh operation on the corresponding row, in response to detecting the control signal.

In a further variation, the memory module implements refresh management (RFM), and scheduling the refresh operation comprises adding an address associated with the corresponding row to a to-be-executed RFM command.

In a further variation, the control logic is further configured to: in response to detecting a collision between the scheduled refresh operation and a memory-access command issued by a memory controller, sending an error message to the memory controller to request the memory controller to resend the memory-access command.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, the methods and processes described above can be included in hardware modules or apparatus. The hardware modules or apparatus can include, but are not limited to, application-specific integrated circuit (ASIC) chips, field-programmable gate arrays (FPGAs), dedicated or shared processors that execute a particular software module or a piece of code at a particular time, and other programmable-logic devices now known or later developed. When the hardware modules or apparatus are activated, they perform the methods and processes included within them.

The foregoing descriptions of embodiments have been presented for purposes of illustration and description only. They are not intended to be exhaustive or to limit the scope of this disclosure to the forms disclosed. Accordingly, many modifications and variations will be apparent to practitioners skilled in the art.

What is claimed is:

1. A memory module, comprising:
    a plurality of rows of memory cells, wherein a respective row comprises one or more canary memory cells that are more susceptible to disturbance than non-canary memory cells; and
    a disturbance-detection circuit coupled to at least one canary memory cell of a corresponding row and configured to output a control signal in response to detecting disturbance to the canary memory cell exceeding a predetermined threshold;
    wherein the disturbance-detection circuit comprises at least a first transistor coupled to a capacitor within the canary memory cell, wherein the first transistor is configured to be turned on when the disturbance to the canary memory cell exceeds the predetermined threshold.

2. The memory module of claim 1, wherein the capacitor is charged to a predetermined level without the disturbance, wherein the disturbance causes the capacitor to discharge, and wherein the first transistor is a p-type transistor such that the p-type transistor is turned on when the capacitor is discharged to a predetermined level.

3. The memory module of claim 2, wherein a group of canary memory cells are respectively coupled to a group of p-type transistors, and wherein the group of p-type transistors are coupled to each other in parallel such that a status change of any one p-type transistor results in the control signal being outputted by the disturbance-detection circuit.

4. The memory module of claim 1, wherein the capacitor is discharged without the disturbance, wherein the disturbance causes the capacitor to charge, and wherein the first transistor is an n-type transistor such that the n-type transistor is turned on when the capacitor is charged to a predetermined level.

5. The memory module of claim 4, wherein a group of canary memory cells are respectively coupled to a group of n-type transistors, and wherein the group of n-type transistors are coupled to each other in parallel such that a status change of any one n-type transistor results in the control signal being outputted by the disturbance-detection circuit.

6. The memory module of claim 1, wherein the disturbance-detection circuit comprises a second transistor coupled to the first transistor, wherein an on-off status of the second transistor is determined by an on-off status of the first transistor, and wherein the disturbance-detection circuit is configured to output the control signal in response to a change of the on-off status of the second transistor.

7. The memory module of claim 1, further comprising a control logic, wherein the control logic is configured to:
    in response to detecting the control signal, schedule a refresh operation on the corresponding row; or
    in response to detecting the control signal, send a notification signal to an external memory controller coupled to the memory module, thereby facilitating the external memory controller to schedule a refresh operation on the corresponding row.

8. The memory module of claim 7, wherein the memory module implements refresh management (RFM), and wherein scheduling the refresh operation comprises adding an address associated with the corresponding row to a to-be-executed RFM command.

9. The memory module of claim 7, wherein the control logic is further configured to:
    in response to detecting a collision between the scheduled refresh operation and a memory-access command issued by a memory controller, sending an error message to the memory controller to request the memory controller to resend the memory-access command.

10. A method for detecting disturbance to a memory module, comprising:
    including one or more canary memory cells in each row of the memory module, wherein the canary memory cells are more susceptible to the disturbance than non-canary memory cells; and
    outputting, by a disturbance-detection circuit coupled to at least one canary memory cell of a corresponding row, a control signal, in response to detecting the disturbance to the canary memory cell exceeding a predetermined threshold;
    wherein the disturbance-detection circuit comprises at least a first transistor coupled to a capacitor within the canary memory cell, wherein the first transistor is configured to be turned on when the disturbance to the canary memory cell exceeds the predetermined threshold.

11. The method of claim 10, wherein the capacitor is charged to a predetermined level without disturbance, wherein the disturbance causes the capacitor to discharge, and wherein the first transistor is a p-type transistor such that the p-type transistor is turned on when the capacitor is discharged to a predetermined level.

12. The method of claim 11, further comprising:
    respectively coupling a group of p-type transistors to a group of canary memory cells; and
    coupling the group of p-type transistors to each other in parallel such that a status change of any one p-type transistor results in the control signal being outputted by the disturbance-detection circuit.

13. The method of claim 10, wherein the capacitor is discharged without disturbance, wherein the disturbance causes the capacitor to charge, and wherein the first transistor is an n-type transistor such that the n-type transistor is turned on when the capacitor is charged to a predetermined level.

14. The method of claim 13, further comprising:
    respectively coupling a group of n-type transistors to a group of canary memory cells; and
    coupling the group of n-type transistors to each other in parallel such that a status change of any one n-type transistor results in the control signal being outputted by the disturbance-detection circuit.

15. The method of claim 10, wherein the disturbance-detection circuit comprises a second transistor coupled to the first transistor, wherein an on-off status of the second transistor is determined by an on-off status of the first transistor, and wherein outputting the control signal comprises:

in response to detecting a change of the on-off status of the second transistor, outputting the control signal.

16. The method of claim 10, further comprising:
in response to detecting, by a control logic of the memory module, the control signal, scheduling a refresh operation on the corresponding row; or
in response to detecting, by the control logic of the memory module, the control signal, sending a notification signal to an external memory controller coupled to the memory module, thereby facilitating the external memory controller to schedule a refresh operation on the corresponding row.

17. The method of claim 16, wherein the memory module implements refresh management (RFM), and wherein scheduling the refresh operation comprises adding an address associated with the corresponding row to a to-be executed RFM command.

18. The method of claim 16, further comprising:
in response to detecting a collision between the scheduled refresh operation and a memory-access command issued by a memory controller, sending an error message to the memory controller to request the memory controller to resend the memory-access command.

* * * * *